(12) United States Patent
Hashimoto

(10) Patent No.: US 9,431,488 B2
(45) Date of Patent: Aug. 30, 2016

(54) COMPOSITE SUBSTRATE OF GALLIUM NITRIDE AND METAL OXIDE

(71) Applicants: SIXPOINT MATERIALS, INC., Buellton, CA (US); SEOUL SEMICONDUCTOR CO., LTD., Seoul (KR)

(72) Inventor: Tadao Hashimoto, Santa Barbara, CA (US)

(73) Assignees: SixPoint Materials, Inc., Buelton, CA (US); Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 14/811,799

(22) Filed: Jul. 28, 2015

(65) Prior Publication Data

US 2015/0340242 A1    Nov. 26, 2015

Related U.S. Application Data

(62) Division of application No. 13/781,509, filed on Feb. 28, 2013, now Pat. No. 9,224,817.

(60) Provisional application No. 61/692,411, filed on Aug. 23, 2012.

(51) Int. Cl.
*H01L 21/311* (2006.01)
*H01L 21/66* (2006.01)
*H01L 29/20* (2006.01)
(Continued)

(52) U.S. Cl.
CPC ....... *H01L 29/2003* (2013.01); *H01L 21/0254* (2013.01); *H01L 21/02389* (2013.01); *H01L 21/02488* (2013.01); *H01L 21/02658* (2013.01); *H01L 21/31111* (2013.01); *H01L 22/12* (2013.01); *H01L 29/32* (2013.01)

(58) Field of Classification Search
None
See application file for complete search history.

(56) References Cited

U.S. PATENT DOCUMENTS 6,656,615 B2    12/2003  Dwiliński et al.
7,078,731 B2    7/2006  D'Eyelyn et al.
(Continued)

FOREIGN PATENT DOCUMENTS

WO    WO2007/008198 A1    1/2007
WO    WO2007/117689 A2    10/2007
(Continued)

OTHER PUBLICATIONS

PCT/US2013/028427 Partial International Search Report mailed Jun. 10, 2013; 2 pp.
(Continued)

*Primary Examiner* — Khaja Ahmad
(74) *Attorney, Agent, or Firm* — Strategic Innovation IP Law Offices, P.C.

(57) ABSTRACT

The present invention discloses a novel composite substrate which solves the problem associated with the quality of substrate surface. The composite substrate has at least two layers comprising the first layer composed of $Ga_xAl_yIn_{1-x-y}N$ ($0 \le x \le 1$, $0 \le x+y \le 1$) and the second layer composed of metal oxide wherein the second layer can be removed with in-situ etching at elevated temperature. The metal oxide layer is designed to act as a protective layer of the first layer until the fabrication of devices. The metal oxide layer is designed so that it can be removed in a fabrication reactor of the devices through gas-phase etching by reactive gas such as ammonia.

23 Claims, 2 Drawing Sheets

(51) Int. Cl.
*H01L 21/02* (2006.01)
*H01L 29/32* (2006.01)

(56) References Cited

U.S. PATENT DOCUMENTS

| | | | |
|---|---|---|---|
| 7,132,730 | B2 | 11/2006 | Dwiliński et al. |
| 7,160,388 | B2 | 1/2007 | Dwiliński et al. |
| 9,224,817 | B2 | 12/2015 | Hashimoto |
| 2002/0069817 | A1 | 6/2002 | Mishra et al. |
| 2004/0067648 | A1 | 4/2004 | Morita et al. |
| 2006/0166440 | A1 | 7/2006 | Kaneoka et al. |
| 2006/0177953 | A1* | 8/2006 | Takeuchi .......... H01L 21/02392 438/29 |
| 2007/0217460 | A1* | 9/2007 | Ishibashi ................ B82Y 20/00 372/45.01 |
| 2007/0234946 | A1 | 10/2007 | Hashimoto et al. |
| 2007/0259504 | A1 | 11/2007 | Bour et al. |
| 2008/0050599 | A1* | 2/2008 | Morita .................... C30B 25/02 428/446 |
| 2008/0105950 | A1 | 5/2008 | Ishida et al. |
| 2009/0315151 | A1* | 12/2009 | Hashimoto ............... C30B 7/10 257/615 |
| 2010/0075175 | A1* | 3/2010 | Poblenz .................. C30B 7/105 428/697 |
| 2011/0186889 | A1 | 8/2011 | Kang et al. |
| 2011/0217505 | A1 | 9/2011 | Callahan |
| 2014/0054595 | A1 | 2/2014 | Hashimoto |

FOREIGN PATENT DOCUMENTS

| | | |
|---|---|---|
| WO | WO2010/112540 A1 | 10/2010 |
| WO | WO2014/031153 A1 | 2/2014 |

OTHER PUBLICATIONS

PCT/US2013/028427 International Search Report and Written Opinion mailed Aug. 14, 2013; 19 pp.

Zang, et al; Defect reduction by periodic SiNx interlayers in gallium nitride grown on Si (111); Journal of Applied Physics 101.093502 (2007); pp. 93502-1 through 093502-4; ISSN: 0021-8979; 2007 American Institute of Physics; USA.

U.S. Appl. No. 13/781,509 Office Action dated May 29, 2014.
U.S. Appl. No. 13/781,509 Amendment dated Aug. 28, 2014.
U.S. Appl. No. 13/781,509 Office Action dated Sep. 12, 2014.
U.S. Appl. No. 13/781,509 Amendment with RCE dated Dec. 11, 2014.
U.S. Appl. No. 13/781,509 Office Action dated Jan. 5, 2015.
U.S. Appl. No. 13/781,509 Amendment dated Apr. 6, 2015.
U.S. Appl. No. 13/781,509 Office Action dated Jun. 26, 2015.
U.S. Appl. No. 13/781,509 Amendment dated Sep. 27, 2015.
U.S. Appl. No. 13/781,509 Notice of Allowance dated Oct. 22, 2015.

\* cited by examiner

COMPOSITE SUBSTRATE OF GALLIUM NITRIDE AND METAL OXIDE

CROSS REFERENCE TO RELATED APPLICATIONS

This application is a Divisional of U.S. patent application Ser. No. 13/781,509, filed Feb. 28, 2013, and entitled "COMPOSITE SUBSTRATE OF GALLIUM NITRIDE AND METAL OXIDE," which claims the benefit of priority to U.S. Provisional Patent Application No. 61/692,411, filed Aug. 23, 2012, and entitled "COMPOSITE SUBSTRATE OF GALLIUM NITRIDE AND METAL OXIDE," the entire contents of each of which are incorporated by reference herein as if put forth in full below.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,";

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

which applications are all incorporated by reference herein in their entirety as if put forth in full below.

BACKGROUND

Field of the Invention

The invention is related to a semiconductor substrate used for various devices including optoelectronic devices such as light emitting diodes (LEDs) and laser diodes (LDs), and electronic devices such as transistors. More specifically, the invention is on a compound semiconductor substrate composed of group III nitride which includes gallium.

Description of the Existing Technology (Note: This patent application refers several publications and patents as indicated with numbers within brackets, e.g., [x]. A list of these publications and patents can be found in the section entitled "References.")

Gallium nitride (GaN) and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. However, the majority of these devices are grown epitaxially on heterogeneous substrates, such as sapphire and silicon carbide since GaN substrates are extremely expensive compared to these heteroepitaxial substrates. The heteroepitaxial growth of group III nitride causes highly defected or even cracked films, which hinder the realization of high-end optical and electronic devices, such as high-brightness LEDs for general lighting or high-power microwave transistors.

To solve all fundamental problems caused by heteroepitaxy, it is indispensable to utilize crystalline group III nitride wafers sliced from bulk group III nitride crystal ingots. For the majority of devices, crystalline GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots. Currently, majority of commercially available GaN substrates are produced by a method called hydride vapor phase epitaxy (HVPE). HVPE is a vapor phase method, which has a difficulty in reducing dislocation density less than $10^5$ cm$^{-2}$.

To obtain high-quality GaN substrates of which dislocation density is less than $10^5$ cm$^{-2}$, a new method called ammonothermal growth has been developed [1-6]. Recently, high-quality GaN substrates having dislocation density less than $10^5$ cm$^{-2}$ can be obtained by the ammonothermal growth. However, when the dislocation density of GaN substrate is reduced to a certain level, quality of the top surface on which devices are fabricated becomes more important to achieve high-performance of such devices.

SUMMARY OF THE INVENTION

The present invention discloses a novel composite substrate which solves problems associated with the quality of substrate surface. The composite substrates has at least two layers comprising the first layer composed of $Ga_xAl_yIn_{1-x-y}N$ ($0 \leq x \leq 1$, $0 \leq x+y \leq 1$) and the second layer composed of metal oxide wherein the second layer can be removed with in-situ etching in a deposition reactor of devices at elevated temperature. The metal oxide layer is designed to act as a protective layer of the first layer until the device layer or structure is deposited. The metal oxide layer is designed so that it can be removed in a deposition reactor of the devices through in-situ etching with a reactive gas such as ammonia.

BRIEF DESCRIPTION OF THE DRAWINGS

Referring now to the drawings in which like reference numbers represent corresponding parts throughout.

DETAILED DESCRIPTION OF THE INVENTION

Overview

Figure 1:
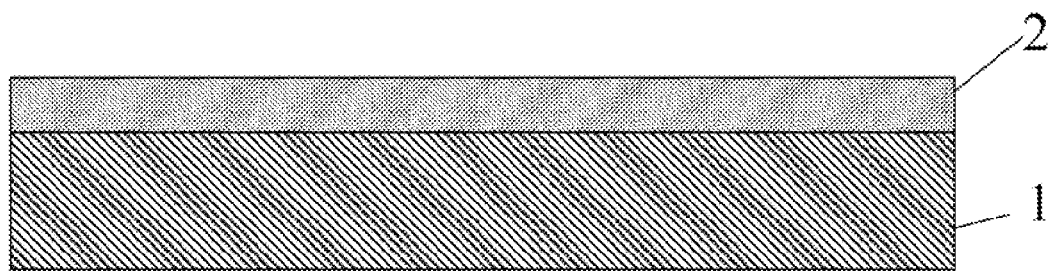
FIG. 1 is a schematic drawing of the composite substrate. In the figure each number represents the followings:
1. The first layer composed of $Ga_xAl_yIn_{1-x-y}N$ ($0 \leq x \leq 1$, $0 \leq x+y \leq 1$)
2. The second layer composed of metal oxide

The composite substrate of the present invention provides a suitable surface for fabricating various optoelectronic and electronic devices such as LEDs, LD, transistors, and photodetectors. Many optoelectronic and electronic devices are fabricated with thin films of group III nitride alloys (i.e. alloys of GaN, AlN and InN). Due to lack of single crystalline substrates of group III nitride, these devices have been fabricated on so-called heteroepitaxial substrates such as sapphire and silicon carbide. Since the heteroepitaxial substrates are chemically and physically different from the group III nitride, the device contains a high density of dislocations ($10^8$~$10^{10}$ $cm^{-2}$) generated at the interface between the heteroepitaxial substrate and the device layer. Such dislocations deteriorate performance and reliability of devices, thus substrates composed of crystalline group III nitride such as GaN and AlN have been developed. Currently, the majority of commercially available GaN substrates is produced with HVPE, which has a difficulty in reducing the dislocation density less than $10^5$ $cm^{-2}$. Although the dislocation density of HVPE-GaN substrates is a few orders of magnitude lower than GaN film on heteroepitaxial substrates, the dislocation density is still a few orders of magnitude higher than typical silicon devices in electronics. To achieve higher device performance, lower dislocation density is required. To attain dislocation density less than $10^5$ $cm^{-2}$, ammonothermal growth, which utilizes supercritical ammonia, has been developed so far. Currently, the ammonothermal method can produce GaN substrates with dislocation density less than $10^5$ $cm^{-2}$. However, when the dislocation density becomes lower, quality of the interface between the substrate and the device layer becomes more important to achieve high performance because new dislocations are generated if the quality of interface is poor. The composite substrate of the present invention can provide a suitable surface for fabricating various optoelectronic and electronic devices such as LEDs, LD, transistors, and photodetectors by providing a metal oxide layer attached to the first layer of group III nitride, which can be removed by in-situ etching at elevated temperature.

Additionally, it may be possible to control the removal step of the metal oxide so that nano-scale or micron-scale metal oxide stays at the termination point of threading dislocations or stacking fault (in the case the substrate is c-plane with large miscut, nonpolar or semipolar) at the surface, which would act as a local mask to prevent defect propagation into the device layer. This selection of removal could be attained by the slight difference of surface energy of the substrate with and without the defect, i.e. the termination point of the threading dislocation or termination line of the stacking fault has different surface energy from the surface without it.

Technical Description of the Invention

Figure 2:
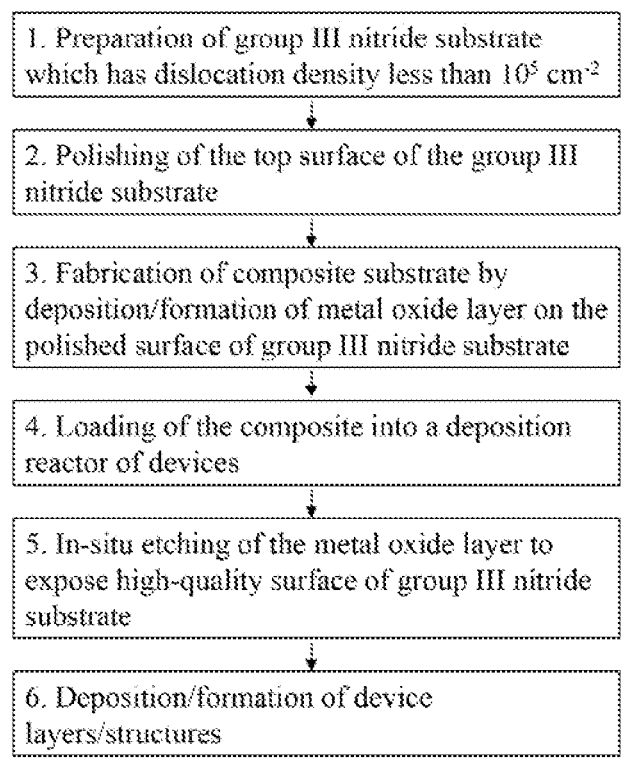
FIG. 2 is an example of process flow for preparing and using the composite substrate.

The current invention of the composite substrate is expected to maximize the benefit of low-dislocation group III substrates [FIG. 1-1] (e.g. GaN) by attaching a metal oxide layer [FIG. 1-2] on the surface on which devices are fabricated. The metal oxide layer on a surface of the group III nitride substrate protects the surface of the group III nitride substrate from mechanical, physical and/or chemical damage until the device layer is deposited on.

A process flow of preparing the composite substrate and usage of it is presented in FIG. 2. By using ammonothermal method or other bulk growth method (such as flux method, high-pressure solution growth), a group III nitride substrate (such as a GaN substrate) with dislocation density less than $10^5$ $cm^{-2}$ is prepared. For commercial use, substrate larger than 1" in diameter and thicker than 200 microns is favorable. The surface on which a device layer or structure is formed is polished to the atomic level. The polishing process typically consists of grinding with diamond tool, lapping with diamond slurry and chemical mechanical polishing typically with colloidal silica. Then, a composite substrate is fabricated by depositing/forming a metal oxide layer on the polished surface of group III nitride substrate. If the polishing process forms a metal oxide layer, we can use the layer as the second layer or we can form an additional layer of metal oxide on top of it. Also, we can intentionally leave the colloidal silica used in the chemical mechanical polishing on the surface as the protective metal oxide layer. The composite substrate is loaded into a reactor to form device layers or structures. Right before device formation, the metal oxide layer is removed by in-situ etching so that high-quality surface of group III nitride is exposed.

The metal oxide layer can be formed by any film deposition methods including physical vapor deposition (PVD), sputtering, CVD, MOCVD, MBE, hydride vapor phase epitaxy (HVPE), hydrothermal deposition, spin-coating, and acid oxidation. The important point is to select a suitable deposition method to form the metal oxide film which can be removed with in-situ etching to expose an "epi-ready" surface of the group III nitride material (a surface suitable for epitaxial deposition of subsequent materials used to construct a device). If the surface of the first layer forms an oxide layer unintentionally (such as group III nitride containing high fraction of Al), the unintentional layer can also be used as is for the second layer, or an additional metal oxide layer can be added on the unintentional layer. The formation of metal oxide layer can be confirmed with surface analysis such as X-ray photoelectron spectroscopy (XPS). XPS is very sensitive to the surface chemical composition. If the shape of signal peak from oxygen is analyzed, one can tell the oxygen peak is from the ambient or oxygen bonded to the surface of the substrate. This way, one can easily confirm that sufficient amount of second layer is formed on the first layer. The oxide layer should be thick enough to protect the surface of the group III nitride from further oxidation, and preferably the layer is thick enough to protect the group III nitride from abrasion or other damage that can occur during wafer handling and storage. At the same time, the oxide layer should be thin enough to be removed with in-situ etching. Also, we can choose the metal oxide which would selectively stays at the termination point of threading dislocation on the substrate surface and act as a local mask to prevent dislocation propagation into the device layer.

The metal oxide is selected from oxide of gallium, aluminum, indium, zinc, magnesium, calcium, sodium, silicon, tin, titanium or other metal so that the metal oxide layer can be removed with an in-situ etching (i.e. etched inside a reactor of device fabrication such as metal organic chemical vapor deposition (MOCVD), molecular beam epitaxy (MBE), chemical vapor deposition (CVD), sputtering, and evaporation). The physical and chemical property of the metal oxide layer is optimized so that the metal oxide layer can be removed by in-situ etching in the ambient containing at least one kind of etching agent such as ammonia, hydrogen, carbon monoxide, hydrogen chloride, hydrogen fluoride, hydrogen bromide, hydrogen iodide, chlorine, fluorine, and boron trichloride. Since group III nitride is thermally stable under ammonia, using ammonia is the most favorable. The temperature for the thermal etching can be any temperature less than 1200° C., but it is favorable to use temperature less than 1050° C. This is because the typical deposition temperature of group III nitride films for devices is 1050° C.

The second layer of the composite substrate protects the surface of the first layer, which will become the interface between the first layer and the device layer. Atomic-scale flatness can be expected because the metal oxide layer protect the first layer physically and/or chemically.

EXAMPLE 1

Zinc oxide layer can be deposited on the Ga-polar surface of c-plane GaN substrate having dislocation density less than $10^5$ cm$^{-2}$ with hydrothermal deposition at 300° C. The thickness of the first layer can be about 300 microns and the thickness of the second layer can be 1 micron. The zinc oxide layer can be etched under ammonia flow in the MOCVD reactor while ramping the substrate temperature. If the ramp time is not long enough to remove all zinc oxide layer, the substrate is maintained at about 1050° C. under ammonia ambient until the GaN layer is exposed. This way, the interface between the GaN substrate and the device layer can be smooth and generation of new dislocations can be avoided.

EXAMPLE 2

Silicon oxide layer can be deposited on the Ga-polar surface of c-plane GaN substrate having dislocation density less than $10^5$ cm$^{-2}$ with a spin-coat technique. The spin-coated composite substrate is baked at about 150° C. The thickness of the first layer can be about 300 microns and the thickness of the second layer can be 10 microns. If the silicon oxide layer is formed at low temperature, the layer can be etched under ammonia flow in the MOCVD reactor while ramping the substrate temperature. If the ramp time is not long enough to remove all silicon oxide layer, the substrate is maintained at about 1050° C. under ammonia ambient until the GaN layer is exposed. This way, the interface between the GaN substrate and the device layer can be smooth and generation of new dislocations can be avoided.

EXAMPLE 3

Gallium oxide layer can be formed on the Ga-polar surface of c-plane GaN substrate having dislocation density less than $10^5$ cm$^{-2}$ with acid etching. The thickness of the first layer can be about 300 microns and the thickness of the second layer can be a few monolayers. The gallium oxide layer can be etched under ammonia flow in the MOCVD reactor while ramping the substrate temperature. If the ramp time is not long enough to remove all gallium oxide layer, the substrate is maintained at about 1050° C. under ammonia ambient until the GaN layer is exposed. This way, the interface between the GaN substrate and the device layer can be smooth and generation of new dislocations can be avoided.

EXAMPLE 4

Mixture of gallium oxide and silicon oxide layer can be formed during polishing process of Ga-polar surface of c-plane GaN substrate having dislocation density less than $10^5$ cm$^{-2}$. In the polishing process, colloidal silica is used to form silicon oxide thin layer. The thickness of the first layer can be about 300 microns and the thickness of the second layer can be a few monolayers. The mixture of gallium oxide and silicon oxide layer can be etched under ammonia flow in the MOCVD reactor while ramping the substrate temperature. If the ramp time is not long enough to remove all oxide layer, the substrate is maintained at about 1050° C. under ammonia ambient until the GaN layer is exposed. This way, the interface between the GaN substrate and the device layer can be smooth and generation of new dislocations can be avoided.

Advantages and Improvements

Even with fine polishing of group III nitride substrates, the surface of the substrate can become dirty from chemical contaminants, scratched from physical damage or deteriorated from various reasons. The current invention of composite substrate can provide smooth interface between group III nitride substrate and device layers by placing a second layer on the group III nitride substrate, which protect the surface of the group III nitride chemically and/or physically until the deposition of device layers begins.

Possible Modifications

Although the preferred embodiment describes GaN substrates, the substrate can be group III nitride alloys of various composition, such as AlN, AlGaN, InN, InGaN, or GaAlInN.

Although the preferred embodiment describes oxide of zinc, silicon and gallium, oxide of other metals such as aluminum, indium, magnesium, calcium, sodium, tin or titanium can also be used. In addition, mixture of metal oxide (such as indium tin oxide) can also be used.

Although the preferred embodiment describes GaN substrate having thickness of 300 microns. other thickness can be used as long as the first layer sustains free-standing.

Although the preferred embodiment describes Ga face of c-plane GaN substrates, other faces such as N face, a-face, m-face, and various semipolar surface can also be used. In addition in the case of group III nitride alloys the surface can be group III polar surface. Also, the surface can be slightly miscut (off-sliced) from these orientations.

Although the preferred embodiment describes in-situ etching in MOCVD reactor, other reactor such as MBE, CVD, sputtering, evaporation, HVPE can be used.

Although the preferred embodiment describes a few methods of oxide formation, other deposition method such as CVD, MOCVD, MBE, sputtering, evaporation, HVPE can be used as long as the metal oxide layer can be removed with in-situ etching.

References

The following references are incorporated by reference herein:

[1] R. Dwiliński, R. Doradziński, J. Garczyński, L. Sierzputowski, Y. Kanbara, U.S. Pat. No. 6,656,615.

[2] R. Dwiliński, R. Doradziński, J. Garczyński, L. Sierzputowski, Y. Kanbara, U.S. Pat. No. 7,132,730.

[3] R. Dwiliński, R. Doradziński, J. Garczyński, L. Sierzputowski, Y. Kanbara, U.S. Pat. No. 7,160,388.

[4] K. Fujito, T. Hashimoto, S. Nakamura, International Patent Application No. PCT/US2005/024239, WO07008198.

[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.

[6] D' Eyelyn, U.S. Pat. No. 7,078,731.

Each of the references above is incorporated by reference in its entirety as if put forth in full herein, and particularly with respect to description of methods of making, using ammonothermal methods, and using these gallium nitride substrates.

What is disclosed by way of example and not by way of limitation is therefore:

1. A composite substrate for device fabrication comprising a first layer composed of $Ga_xAl_yIn_{1-x-y}N$ ($0 \leq x \leq 1$, $0 \leq x+y \leq 1$) and a second layer attached to a surface of the first layer, wherein the second layer is composed of a metal oxide which partially or fully covers the first layer and which can be removed by in-situ etching in a device fabrication reactor.

2. A composite substrate for device fabrication comprising a first layer composed of $Ga_xAl_yIn_{1-x-y}N$ ($0 \leq x \leq 1$, $0 \leq x+y \leq 1$) and a metal oxide which partially or fully covers a surface of the first layer, wherein the metal oxide is removable by in-situ etching in a device fabrication reactor, and wherein a portion or portions of the metal oxide are positioned at termination points of threading dislocations or a termination line of stacking faults to provide a local mask to prevent propagation of the threading dislocations or stacking fault.

3. A composite substrate of paragraph 1 or paragraph 2 wherein the second layer can be removed by etching at 1050° C. or lower with ammonia.

4. A composite substrate of any of paragraphs 1-3 and wherein the metal oxide contains at least one oxide of gallium, aluminum, indium, zinc, magnesium, calcium, sodium, silicon, tin and titanium.

5. A composite substrate of any of paragraphs 1-4 wherein the metal oxide is more than one atomic layer thick.

6. A composite substrate of paragraph 5 wherein the thickness of the metal oxide is large enough to be detected with x-ray photoelectron spectroscopy.

7. A composite substrate of any of paragraphs 1 through 6 wherein the first layer comprises highly-oriented poly crystalline or single crystalline GaN.

8. A composite substrate of paragraph 7 wherein the density of dislocations and grain boundaries of the crystalline GaN is less than $10^5$ cm$^{-2}$.

9. A composite substrate of paragraph 7 wherein the metal oxide is on the gallium face of the first layer.

10. A composite substrate of paragraph 7 wherein the metal oxide is on the nitrogen face of the first layer.

11. A composite substrate of paragraph 7 wherein the metal oxide is on the non-polar m-face or a-face of the first layer.

12. A composite substrate of paragraph 7 wherein the metal oxide is on the gallium side semipolar face of the first layer.

13. A composite substrate of paragraph 7 wherein the metal oxide is on the nitrogen side semipolar face of the first layer.

14. A composite substrate of any of paragraphs 1 through 13 wherein the metal oxide is deposited onto and therefore intentionally formed on the first layer.

15. A method of protecting a surface of a group III-nitride wafer comprising forming a protective layer upon a face of the wafer, the protective layer having sufficient thickness to protect the face from atmospheric oxidation during storage of the wafer.

16. A method of making an optical, electronic, or optoelectronic device comprising removing a protective layer from a face of a group III-nitride wafer in a deposition reactor, and subsequently depositing a first electronic, optical, or opto-electronic material from which an electronic, optical, or opto-electronic device is formed.

What is claimed is:

1. A method comprising:
   a. forming a protective metal oxide layer upon a face of a group III-nitride wafer prior to loading the wafer in a device fabrication reactor,
      i. wherein the group III-nitride wafer's face is of sufficient quality for epitaxial deposition of subsequent materials used to construct a device on said face, and
      ii. wherein
         1. the protective metal oxide layer is capable of being etched by a chemical in the device fabrication reactor,
         2. the protective metal oxide layer is sufficiently thick to protect the face from mechanical, physical and/or chemical damage during storage, transport and/or handling of the wafer, and
         3. the protective metal oxide layer is sufficiently thin to be removed in the device fabrication reactor, and
   b. storing said wafer.

2. The method of claim 1 further comprising removing the protective metal oxide layer in the device fabrication reactor.

3. The method of claim 2, wherein the protective metal oxide layer is removed using an etchant that comprises ammonia.

4. The method of claim 3, wherein the protective metal oxide layer is removed during an etch at a temperature less than 1050° C.

5. The method of claim 2, wherein the protective metal oxide layer is removed during an etch at a temperature less than 1050° C.

6. The method of claim 5, wherein the act of etching the wafer is performed during temperature ramp-up to a temperature for deposition in the device fabrication reactor.

7. The method of claim 2, wherein a portion of the metal oxide remains at a termination point of a threading dislocation on said face.

8. The method of claim 1, wherein the mechanical, physical and/or chemical damage is abrasion during wafer transport and/or handling.

9. The method of claim 1, wherein the mechanical, physical and/or chemical damage is surface contamination.

10. The method of claim 1, wherein the group III-nitride wafer has a Ga-polar surface and the metal oxide layer is formed on the Ga-polar surface.

11. The method of claim 1, wherein the protective metal oxide layer comprises a silicon oxide layer.

12. The method of claim 11, wherein the silicon oxide layer is spin-coated onto the wafer.

13. The method of claim 11, wherein the silicon oxide layer is formed at a temperature that is sufficiently low that the silicon oxide layer can be etched using ammonia.

14. The method of claim 13, wherein the silicon oxide layer comprises colloidal silica.

15. The method of claim 1, wherein the protective metal oxide layer comprises a gallium oxide layer.

16. The method of claim 15, wherein the gallium oxide layer is at least a few monolayers in thickness.

17. The method of claim 1, wherein the method further comprises removing the protective metal oxide layer in the device fabrication reactor.

18. The method of claim 1, wherein the method further comprises a surface analysis to determine a thickness of the metal oxide layer.

19. The method of claim 18, wherein the surface analysis comprises X-ray photoelectron spectroscopy.

20. A method comprising comprising:
   a. forming a protective metal oxide layer upon a face of a group III-nitride wafer prior to loading the wafer in a device fabrication reactor,
      i. wherein the group III-nitride wafer's face is of sufficient quality for epitaxial deposition of subsequent materials used to construct a device on said face, and
      ii. wherein
         1. the protective metal oxide layer is capable of being etched by a chemical in the device fabrication reactor,
         2. the protective metal oxide layer is sufficiently thick to protect the face from mechanical, physical and/or chemical damage during storage, transport and/or handling of the wafer, and
         3. the protective metal oxide layer is sufficiently thin to be removed in the device fabrication reactor, and
   b. removing the protective metal oxide layer in the device fabrication reactor prior to forming the device.

21. The method of claim 20, wherein the etchant is selected from ammonia, hydrogen, carbon monoxide, hydrogen chloride, hydrogen fluoride, hydrogen bromide, hydrogen iodide, chlorine, fluorine, and boron trichloride.

22. The method of claim 20, wherein the protective metal oxide layer is completely removed prior to forming the device.

23. The method of claim 20, wherein the protective metal oxide layer is removed from the wafer's face but portions of the protective metal oxide layer remain at termination points of threading dislocations or stacking faults to provide a local mask to prevent defect propagation into the device during device fabrication.

* * * * *